United States Patent [19]

Kuroda

[11] 4,412,195

[45] Oct. 25, 1983

[54] SUPERCONDUCTING SOLENOID COIL

[75] Inventor: Kunishige Kuroda, Hitachi, Japan

[73] Assignee: Hitachi, Ltd., Tokyo, Japan

[21] Appl. No.: 368,662

[22] Filed: Apr. 15, 1982

[30] Foreign Application Priority Data

Apr. 17, 1981 [JP] Japan .................................. 56-57106

[51] Int. Cl.³ .............................................. H01F 7/22
[52] U.S. Cl. ................... 335/216; 174/126 S
[58] Field of Search .................... 335/216; 174/126 S, 174/128 S; 324/319

[56] References Cited

U.S. PATENT DOCUMENTS 4,213,092 7/1980 Kneip ................................. 324/319

OTHER PUBLICATIONS

Design of High Homogeneity Inside-Notch-Connected Superconducting Solenoids, Canadian Journal of Physics, vol. 47, 1969.

Primary Examiner—George Harris
Attorney, Agent, or Firm—Antonelli, Terry & Wands

[57] ABSTRACT

Disclosed is a superconducting solenoid coil of small size exhibiting a high degree of magnetic field uniformity. Emphasis is placed on the improvement in the magnetic field uniformity in a limited central active space of the coil, and, for this purpose, at least a portion of the cylindrical inner surface of the coil is shaped into a quadric configuration. The radius of curvature of this quadric portion is preferably less than a predetermined value relative to the axial total length of the coil.

9 Claims, 6 Drawing Figures

FIG. IA
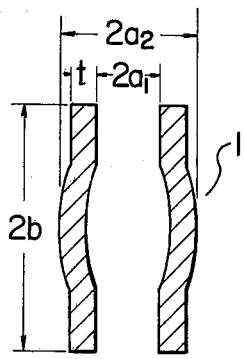
FIG. IB
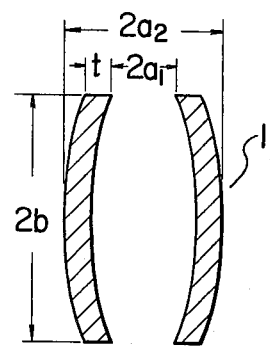
FIG. 2
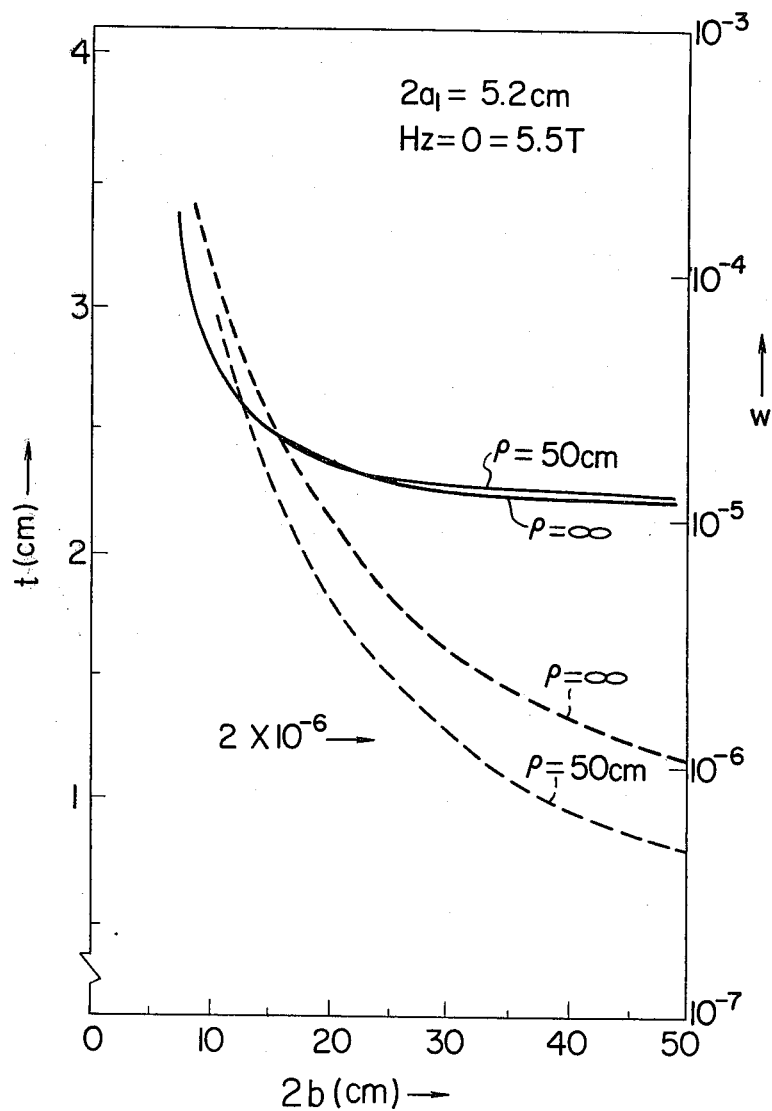

SUPERCONDUCTING SOLENOID COIL

BACKGROUND OF THE INVENTION

This invention relates to superconducting solenoid coils, and more particularly to a superconducting solenoid coil which is improved in the uniformity of the magnetic field in the central operation space of the coil.

The uniformity of the magnetic field produced in the central operation space of a superconducting solenoid coil (which will be referred to hereinafter merely as a coil) has been improved by increasing the axial length of the coil or by decreasing the axial length of the coil and concentrating the magnetomotive force in both end portions of the coil. The strength of the magnetic field produced by a coil of this kind is generally chiefly dependent upon the inner diameter and outer diameter of the coil, and the coil length larger than a certain limit does not substantially contribute to an increase in the field strength but contributes merely to a better uniformity of the magnetic field. The magnetic field uniformity $\epsilon$ is defined herein as $$\epsilon = \frac{|H_{z=0} - H_{z=2.5\,mm}|}{H_{z=0}}$$

where $H_{z=0}$ represents the field strength at the middle point of the central axis of the coil, and $H_{z=2.5\,mm}$ represents the field strength at the point spaced by 2.5 mm from the middle point on the coil central axis. The magnetic field uniformity $\epsilon$ above described can be defined as the distribution of the magnetic field strength in the axial direction of the coil, since the field strength in a plane orthogonal with respect to the coil central axis is approximately uniform in the vicinity of the coil central axis. In order to provide a very high degree of magnetic field uniformity in a solenoid coil having such a property, it is a common design practice to concentrate the magnetomotive force in the both end portions of the coil and to make the coil length as short as possible. Such a coil is generally offered in three types. The first type called the outer notch type is provided by winding a hollow cylindrical main coil and then winding an outer shim coil on the outside of the both end portions of the cylindrical main coil. The second type called the inner notch type is provided by winding an inner shim coil and then winding a cylindrical main coil on the outside of the shim coil. In the third type, a cavity is formed within a thickness of a main coil wound in cylindrical form.

In any one of the three coil types so designed, the length of the coil must be selected to be nearly ten times as large as the inner diameter of the coil, in order that the magnetic field produced by the coil can attain a uniformity of the order of $10^{-6}$ to $10^{-7}$ within a sphere having a diameter of 5 mm formed in the middle of the coil length. The greatest defect of the coil so sized is that the proportion of the volume occupied by the coil to the volume of the space providing a high degree of magnetic field uniformity is very large, and this defect is still left as a subject to be solved.

SUMMARY OF THE INVENTION

It is an object of the present invention to provide a superconducting solenoid coil which is improved in a magnetic field uniformity over the prior art ones.

Another object of the present invention is to provide a small-sized superconducting solenoid coil providing the desired high degree of uniformity of the magnetic field.

The superconducting solenoid coil according to the present invention is featured by the fact that emphasis is placed on the improvement in the uniformity of the magnetic field in a predetermined limited operation space in the middle part of the coil, and the inner surface configuration of the prior art cylindrical coil is locally or totally modified into a curved configuration.

BRIEF DESCRIPTION OF THE DRAWINGS

FIGS. 1A and 1B show two embodiments of the superconducting solenoid coil of the present invention, respectively.

FIG. 2 is a graph showing the results of calculation to illustrate how the coil according to the present invention is effective over a prior art one.

DESCRIPTION OF THE PREFERRED EMBODIMENTS

Figure 3:
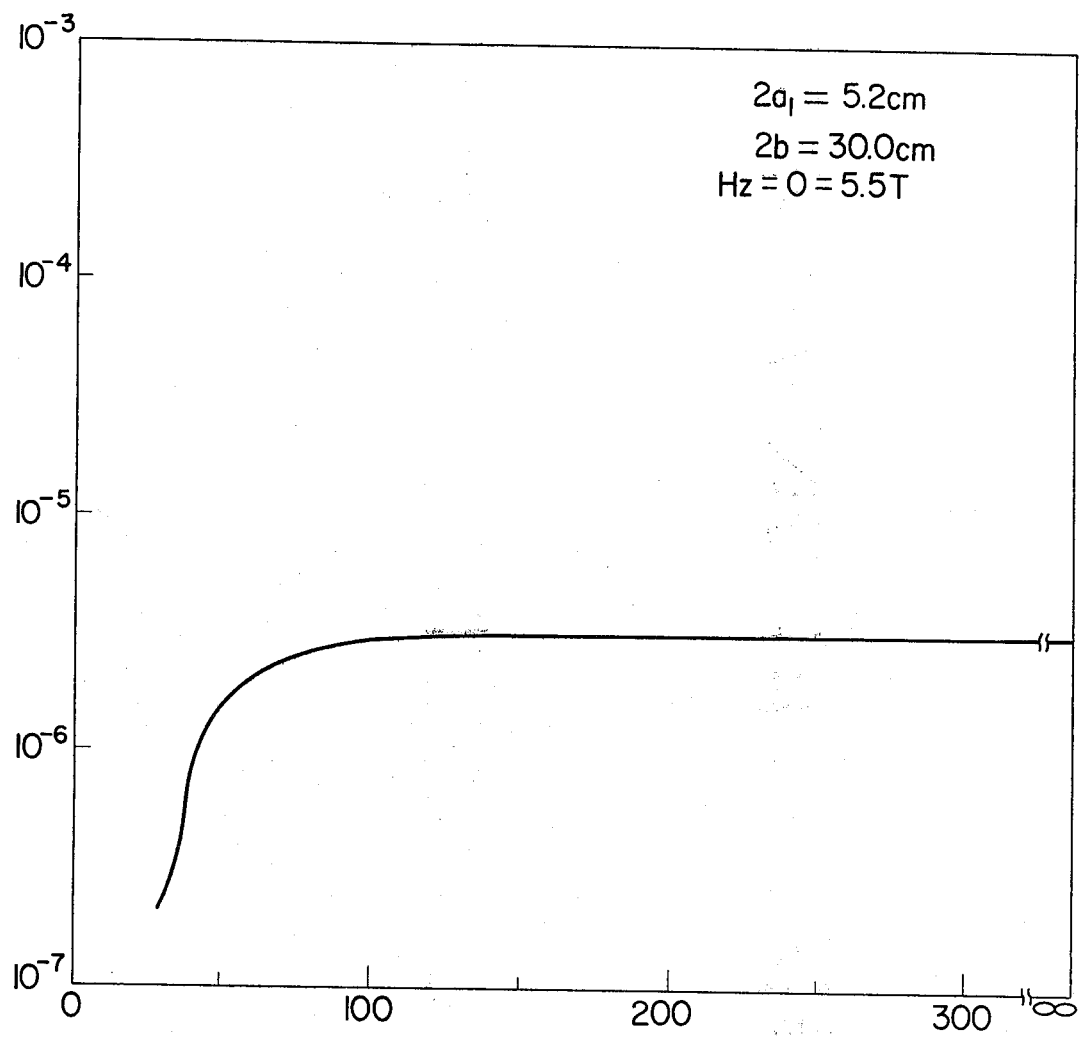
FIG. 3 is a graph showing the results of calculation of the relation between the magnetic field uniformity and the radius of curvature of the quadric inner surface configuration of the solenoid coil according to the present invention.

FIGS. 1A and 1B show the axial sectional shape of two embodiments of the superconducting solenoid coil of the present invention respectively. In the coil 1 shown in FIG. 1A, a localized spherical surface portion is formed in the middle of the inner surface of the coil 1, and, in the coil 1 shown in FIG. 1B, the inner surface of the coil 1 is totally configured to be a spherical surface. In these two embodiments, the radius of curvature of the spherical surface portions is the same. The length $2b$ of the coil 1 shown in FIG. 1A is larger than that of the coil 1 shown in FIG. 1B. In each of the embodiments, the thickness of the conductor turns constituting the coil 1 is uniform, and the outer surface is also configured to be spherical. Therefore, when the radius of curvature of the spherical surface portion is not extremely small, the coil can be wound in substantially the same manner as that used for winding conventional solenoid coils without being encountered with any especial practical difficulty.

Now, the embodiments of the present invention shown in FIGS. 1A and 1B will be compared with a prior art one so as to clarify the advantage of the present invention. Suppose that the strength $H_{z=0}$ of the magnetic field at the middle point on the central axis of each of the coils is 5.5 T (Teslas), the inner diameter $2a_1$ of the prior art cylindrical coil is 5.2 cm, the inner diameter $2a_1$ at both ends of the coil of the present invention is 5.2 cm, and the radius of curvature $\rho$ of the spherical inner surface portion of the coil of the present invention is 50 cm which is kept constant. Under the above conditions, calculation was made to find how the coil thickness $t$ and the maximum field uniformity $\epsilon$ within an imaginary sphere of 5 mm diameter existing in the middle of the coil are related to the coil length $2b$, and the results of the calculation are shown in FIG. 2.

The calculation is based on the following elliptic integral:

$$H_z = \frac{j}{c} \int_0^{2\pi} \int_{-b}^{b} \int_{a_1}^{a_2} \frac{\gamma - \gamma' \cos\theta}{[\gamma^2 + \gamma'^2 + (z - z')^2 - 2\gamma\gamma' \cos\theta]^{3/2}} \gamma \cdot d\theta \cdot d\gamma \cdot dz$$

In the above expression, Hz represents the field strength at a point P ($\gamma'$, $\theta'$, $z'$) expressed by the cylindrical coordinate system, and the middle point of the coil is selected to be the point O ($\gamma$, $\theta$, $z$) on the cylindrical coordinate system. The strength of the magnetic field at the middle point of the coil on the central axis of the coil is $H_{z=0} = 5.5$ Teslas as described already. Further, in the above expression, c represents the velocity of light, j represents the value of current flowing through a single conductor, b represents ½ of the value of the coil length 2b, and $a_1$ and $a_2$ represent ½ of the values of the inner and outer diameters $2a_1$ and $2a_2$ of the coil respectively.

The mean current density in the conductor turns constituting the coil was assumed to be 125 A/mm² in the calculation. Needless to mention, the coils compared with each other were solenoid coils of the same thickness not having shim coils. In FIG. 2, the curves indicated by $\rho$ (the radius of curvature of the spherical surface portion) = 50 cm and $\rho = \infty$ represent the results observed on the coils of the present invention and prior art respectively. Further, the solid curves indicate the relation between the coil length 2b and the coil thickness t, and the dotted curves indicate the relation between the coil length 2b and the magnetic field uniformity $\epsilon$. It will be seen from FIG. 2 that, according to the curves indicating the relation between the coil length 2b and the coil thickness t, any substantial change does not appear, hence, saturation occurs in the range of $2b \geq 30$ cm, and an increase in the coil length 2b beyond a limit is not effective in increasing the strength of the magnetic field. Comparision between the coil of the present invention and the prior art one proves that the thickness t of the coil of the present invention having the increased inner diameter $2a_1$ in its middle part is larger than that of the prior art one, although very slightly.

On the other hand, the larger the coil length 2b, the better is the magnetic field uniformity $\epsilon$, and the uniformity of the coil of the present invention is better than that of the prior art one. Now, the sectional area of the coil of the present invention will be compared with that of the prior art one under the condition of the magnetic field uniformity $\epsilon$ of $2 \times 10^{-6}$. The result of comparison proves that $2b = 26.0$ cm and $t = 2.30$ cm in the case of the coil of the present invention, whereas $2b = 36.5$ cm and $t = 2.23$ cm in the case of the prior art one. Thus, the coil sectional area can be decreased by 26.53% according to the present invention from that of the prior art coil. In other words, the magnetic field uniformity $\epsilon$ can be improved to $9 \times 10^{-7}$ from the prior art value of $2 \times 10^{-6}$ when the coil length is set at $2b = 36.5$ cm. It will be seen from FIG. 2 that the larger the coil length 2b, the greater is the effect of the present invention. Therefore, the form shown in FIG. 1A is more effective than that shown in FIG. 1B for the desired improvement in the uniformity of the magnetic field. That is, formation of a localized quadric in the inner surface of the coil is more effective than when the inner surface is totally configured to be quadric.

In an example of the solenoid coil of the present invention, the outer diameter $2a_2$ of the coil is 9.7 cm and the number of superposed conductor layers of the coil is about 33 when the diameter of the conductors is 0.4 mm and the coil length 2b in FIG. 2 is 30 cm.

Next, the coil length 2b was fixed constant at the value of 30.0 cm, and calculation was made to find the relation between the radius of curvature $\rho$ and the magnetic field uniformity $\epsilon$ within an imaginary sphere of 5 mm$\phi$. FIG. 3 shows the results of the calculation. Other conditions used in the calculation were similar to those used in the former calculation the results of which are shown in FIG. 2. More precisely, the inner diameter $2a_1$ of the coil, the mean current density in the conductor turns constituting the coil and the magnetic field strength at the coil middle point were 5.2 cm, 200 A/mm² and 5.5 T respectively.

It will be seen from FIG. 3 that the smaller the radius of curvature $\rho$, the better is the magnetic field uniformity $\epsilon$, and the uniformity $\epsilon$ can be improved by one order (i.e., from $10^{-n}$ to $10^{-(n+1)}$) when the value at $\rho = 32$ cm is compared with the value at $\rho = \infty$. With the further decrease in the value of $\rho$, the degree of improvement in the magnetic field uniformity $\epsilon$ decreases correspondingly, and the uniformity $\epsilon$ at $\eta = 0$ is to be naturally equal to that at $\rho = \infty$. Therefore, as described already with reference to FIG. 2, it can be seen from FIG. 3 that the form shown in FIG. 1A is more advantageous than that shown in FIG. 1B for the desired improvement in the magnetic field uniformity $\epsilon$. It will be unable to wind the coil as a matter of fact when the radius of curvature $\rho$ is selected to be extremely small, and therefore, the value of $\rho$ is limited from the aspect of feasibility of coil winding operation. Thus, practically, it is necessary to determine the minimum value of $\rho$ taking into account the values of $a_1$, b, etc.

Needless to mention, the magnetic field distribution remains unchanged and the magnetic field uniformity does not also change when the dimensions $a_1$, $a_2$ and b of the coil are changed in proportional relation. Accordingly, the above discussion applies intact when a coil shape resulting from a modification of coil dimensions is still analogous to the original shape.

Figure 4A:
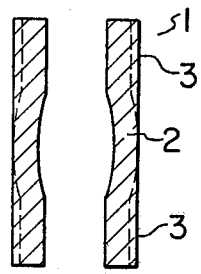
FIGS. 4A and 4B show other embodiments of the superconducting solenoid coil of the present invention, respectively.
Figure 4B:
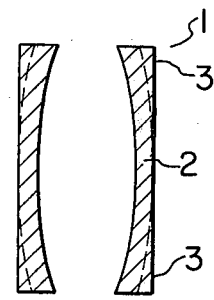

The foregoing discussion has been directed to a solenoid coil of the kind not provided with the so-called shim coil. However, it may be sometimes necessary to add a shim coil to both end portions of the solenoid coil to concentrate the magnetomotive force in the coil ends, so as to further improve the magnetic field uniformity. This method has also been employed in a prior art coil of this kind, and, according to the prior art practice, a projecting coil portion projecting outward or inward from the outer or inner surface of the coil has been provided. In the present invention, such a portion may be provided by winding a shim coil in such a manner that the outer surface of the coil is finished to be a cylindrical surface having a uniform diameter. Such a shim coil arrangement is convenient in that the magnetomotive force increases gradually towards the coil ends from the middle point of the coil, thereby ensuring the desired improvement in the magnetic field uniformity and eliminating the necessity for supporting the shim coil otherwise which will be moved by an electromagnetic force. Other embodiments of the present invention including such a shim coil arrangement are shown in FIGS. 4A and 4B respectively. It may be said that the forms shown in FIGS. 4A and 4B are provided by adding trapezoid-like or wedge-like shim coils 3 to the forms shown in FIGS. 1A and 1B respectively. Needless to mention, a coil having a sectional shape as shown in FIG. 4A or 4B may be designed to attain the desired magnetic field strength and magnetic field uniformity, or the mean current density in the shim coil portions 3 may be designed to be different from that in the main coil portion 2 for the purpose of attainment of the desired magnetic field strength and magnetic field uniformity.

While the inner surface of the solenoid coil has been described to be spherical in the aforementioned embodiments of the present invention, it may be a curved configuration or an ellipsoid or a part of a paraboloid. The requirements are that the inner surface is smooth, makes point symmetry with respect to a point on the central axis of the coil, and has a largest diameter in the middle part of the coil and a smallest diameter at the coil ends.

It will be understood from the foregoing description that the present invention provides a superconducting solenoid coil capable of attainment of the desired high degree of uniformity of the magnetic field, which can be designed to have a coil length as large as only about ¾ of prior art ones and which can be manufactured at greatly reduced material and production costs. The superconducting solenoid coil of the present invention contributes greatly to and finds a useful industrial application in the fields of, for example, nuclear magnetic resonance and electron spin resonance in which such a coil is essentially required.

I claim:

1. A superconducting solenoid coil having an inner surface portion of curved configuration in axial section, the radius of said inner surface portion being largest at the middle point of the central axis of said coil and decreasing towards the both ends of said coil, said inner surface portion making point symmetry with respect to a point on said central axis and extending over at least a part of the axial total length of said coil.

2. A superconducting solenoid coil as claimed in claim 1, further comprising a shim coil provided on the outer surface of both end portions of said solenoid coil.

3. A superconducting solenoid coil as claimed in claim 2, wherein said shim coil is provided on said solenoid coil to render cylindrical the outer surface of said solenoid coil.

4. A superconducting solenoid coil as claimed in claim 1, wherein said inner surface portion has a radius of curvature less than a predetermined value relative to the predetermined total length of said solenoid coil.

5. A superconducting solenoid coil of substantially annular shape, wherein an inner surface of said coil has a surface portion curved such that the diameter of a circular cross section of said inner surface is largest at the middle point of said coil and gradually decreases towards both ends of said coil, said surface portion making point symmetry with respect to said middle point.

6. A superconducting solenoid coil as claimed in claim 5, wherein said inner surface extends over both ends of said coil.

7. A superconducting solenoid coil as claimed in claim 5, wherein said surface portion is spherical.

8. A superconducting solenoid coil as claimed in claim 5, further comprising at least one shim coil provided on an outer surface of an end of said solenoid coil.

9. A superconducting solenoid coil as claimed in claim 8, wherein a plurality of shim coils are provided on said solenoid coil to render the outer surface of said solenoid coil substantially cylindrical.

* * * * *